United States Patent
Yang et al.

(10) Patent No.: US 6,209,551 B1
(45) Date of Patent: *Apr. 3, 2001

(54) METHODS AND COMPOSITIONS FOR POST-ETCH LAYER STACK TREATMENT IN SEMICONDUCTOR FABRICATION

(75) Inventors: Chan-Syun David Yang, Los Gatos; Yun-Yen Jack Yang, San Jose, both of CA (US)

(73) Assignee: Lam Research Corporation, Fremont, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/873,611

(22) Filed: Jun. 11, 1997

(51) Int. Cl.[7] .................................................. H01L 21/302
(52) U.S. Cl. .......................... 134/1.2; 438/725; 438/714; 438/734; 216/49
(58) Field of Search .............................. 134/1.2; 438/725, 438/734, 714; 216/49

(56) References Cited

U.S. PATENT DOCUMENTS

| | | | |
|---|---|---|---|
| 5,221,424 | * 6/1993 | Rhoades | 156/665 |
| 5,397,432 | * 3/1995 | Konno et al. | 156/665 |
| 5,545,289 | * 8/1996 | Chen et al. | 156/643.1 |
| 5,631,803 | * 5/1997 | Cameron et al. | 361/234 |
| 5,679,211 | * 10/1997 | Huang | 156/643.1 |

FOREIGN PATENT DOCUMENTS

| | | |
|---|---|---|
| 0 387 097 | 3/1990 | (EP). |
| 6-349786 | * 12/1994 | (JP). |
| 95/22171 | 8/1995 | (WO). |
| WO 95/22171 | 8/1995 | (WO). |

OTHER PUBLICATIONS

Applicant: Lam Research Corporation, International Search Report, Application Serial No. PCT/US98/11617, International Filing Date Jun. 10, 1998, mailed Sep.24, 1998, 6 pages.

Fujimura et al., "Resist Stripping in an $O_2$+ $H_2O$ Plasma Downstream" *J. Vac. Sci. Technol.* B.9 (2) Mar./Apr. 1991.

* cited by examiner

*Primary Examiner*—Gregory Mills
*Assistant Examiner*—George Goudreau
(74) *Attorney, Agent, or Firm*—Beyer Weaver & Thomas, LLP

(57) ABSTRACT

Methods and compositions for treating a wafer's layer stack following metal etching are provided. The methods involve providing a semiconductor wafer layer stack in a plasma processing system following metal etch, and treating the layer stack with one or more process gases in a plasma processing system, where at least one of the process gases contains helium and water and/or oxygen, or comparable gases. The methods and compositions reduce corrosion and polymer fence for a wafer's layer stack relative to conventional passivation and strip processes without helium, decrease the time necessary for passivation, increase the strip rate, and/or improve strip uniformity.

18 Claims, 4 Drawing Sheets

METHODS AND COMPOSITIONS FOR POST-ETCH LAYER STACK TREATMENT IN SEMICONDUCTOR FABRICATION

BACKGROUND OF THE INVENTION

The present invention relates to the fabrication of semiconductor integrated circuits (ICs). More particularly, the present invention relates to improved treatment of a wafer's layer stack using helium following metal etch.

In semiconductor IC fabrication, devices such as component transistors are formed on a semiconductor wafer or substrate, which is typically made of silicon. Metallic interconnect lines, which are etched from a metal layer disposed above the wafer, may then be employed to couple the devices together to form the desired circuit. These metal layers are typically made of aluminum, copper, or one of the known aluminum alloys. Metal etchants usually contain chlorine ($Cl_2$), a highly selective aluminum etchant. Commonly used metal etchants may include, for example, $BCl_3/Cl_2$, $HCl/Cl_2$ and $BCl_3/Cl_2/SF_6$, but any metal etch process that involves chloride or fluoride compounds may be employed.

The etched layer stack may then be subjected to a strip process to remove the photoresist (often polymeric in nature) applied prior to the metal etch to those areas of the layer stack which are not to be etched. Stripping may be conducted with a plasma asher. In this device, $O_2$ is excited into a plasma which dissociates the $O_2$ into various oxygen radicals and ion species that oxidize (ash) the photoresist. The volatile waste products formed by this ashing may then be exhausted away.

To facilitate discussion, FIG. 1A illustrates a cross-sectional view of a layer stack 100, representing the layers formed during the processing of a typical substrate, e.g., one that may be employed to fabricate integrated circuits or flat panel displays. FIG. 1A depicts the layer stack after conventional metal etching has been completed, but before passivation and strip treatment. It should be noted that other additional layers above, below, or between the layers shown may be present. Further, not all of the shown layers need necessarily be present and some or all may be substituted by other different layers.

At the bottom of layer stack 100, there is shown a substrate 102, typically composed of Si. An oxide layer 104, typically comprising $SiO_2$, is formed above substrate 102. As noted above, additional layers (not shown) may be interposed between the substrate 102 and the oxide layer 104. One or more barrier layers 106 typically formed of Ti, TiN or other suitable barrier materials, may be disposed between oxide layer 104 and a subsequently deposited metal layer 108. Barrier layer(s) 106, when provided, functions to prevent the diffusion of silicon atoms from oxide layer 104 into the metal layer 108.

Metal layer 108 typically comprises copper, aluminum or one of the known aluminum alloys such as Al—Cu, Al—Si, or Al—Cu—Si. For convenience, the metal layer 108 is referred to herein as the aluminum layer although it should be understood that such a reference may include a layer consisting of any of the aforementioned aluminum alloys. The remaining two layers of FIG. 1, i.e., an anti-reflective coating (ARC) layer 110 and an overlaying photoresist (PR) layer 112, are then formed atop metal layer 108. The ARC layer 110, typically comprising TiN or other suitable material, helps prevent light (e.g., from the lithography step that patterns the photoresist) from being reflected and scattered off the surface of the metal layer 108. Photoresist layer 112 represents a layer of conventional photoresist material (typically I-line), which may be patterned for etching, e.g., through exposure to ultra-violet rays. The layers of layer stack 100 are readily recognizable to those skilled in the art and may be formed using any of a number of suitable and known deposition processes, including chemical vapor deposition (CVD), plasma-enhanced chemical vapor deposition (PECVD), and physical vapor deposition (PVD).

To form the aforementioned metallic interconnect lines, a portion (indicated by arrow 115) of the layers of the layer stack, including the metal layer, e.g., metal layer 108, are etched in a suitable process. By way of example, one such process involves the patterning of a photoresist layer 112 by exposing the photoresist material in a lithography system, and the development of the photoresist material to form a mask to facilitate subsequent etching. Using an appropriate etchant, the areas of the metal layer that are unprotected by the mask are then etched away, leaving behind metal interconnect lines or features.

Following metal etch, a chlorine residue from the etch by-products may remain on the metal features of the layer stack. Unless it is removed, this chlorine residue may cause corrosion of the metal layer when the layer stack is exposed to air. Therefore, the layer stack is typically subjected to a passivation treatment using $H_2O$ or an $H_2O/O_2$ mixture in a plasma environment in order to remove this chlorine residue. Such a typical conventional passivation process may result in the removal of chlorine etchant residue in approximately 60 s.

For illustrative purposes, FIG. 1B shows an expanded cross-sectional view of layer stack 100 of FIG. 1A after conventional etching, passivation and strip have been completed. The rate at which the photoresist is removed by the strip process is called the "strip rate." In the figure, arrow 122 represents the photoresist removed by the conventional strip process. A typical conventional strip rate using pure $H_2O$, for example, results in the removal of a typical photoresist layer 122 at, for example, about 1 micron per minute ($\mu$m/min).

A further parameter of the strip process is strip "uniformity." Uniformity is a relative measure of strip rate across a wafer, typically obtained by the 1σ method:

$$\frac{\sqrt{\sum (|r_i - \bar{r}|)^2}}{(n-1)\bar{r}} \times 100\%$$

where $r_i$ is a measurement of the thickness of material removed at a particular point, i, on the wafer, $\bar{r}$ is the average thickness of material removed at all measured points on the wafer, and n is the number of points at which measurements are taken. According to one variation of this method, forty-nine predetermined points on the wafer are measured pre- and post-ashing. Ideally, the strip rate should be as uniform as possible across the wafer so that strip time will be minimized.

Chlorine and other species with which the layer stack is bombarded during etching may modify the chemical composition of the sidewalls of the photoresist, so that the conventional strip process may be ineffective for its removal. As a result, a "polymer fence" composed of these modified photoresist sidewalls may remain following the strip process. This polymer fence 120 (as depicted, for example, in FIG. 1B) may be removed by a wet chemical process well known in the art in order to finish the semiconductor IC or prepare it for the next fabrication step.

While conventional passivation and strip processes have proven effective for semiconductor IC fabrication, improved passivation and strip processes which decrease the time necessary for passivation, increase the strip rate, and/or improve strip uniformity would be desirable.

SUMMARY OF THE INVENTION

The invention relates to improved treatment of a semiconductor wafer's layer stack following metal etch. The improved treatment includes passivation and/or strip processes and compositions including helium which decrease the time necessary for passivation, increase the strip rate, and/or improve strip uniformity.

One embodiment of the present invention is a method for treating a semiconductor wafer's layer stack following metal etching. The method involves providing a semiconductor wafer layer stack in a plasma processing system following metal etch, and treating the layer stack in one or more steps, with at least one process gas which contains helium and water and/or oxygen, or comparable gases. The method reduces corrosion and polymer fence for a wafer's layer stack relative to conventional treatment processes without helium.

In another embodiment, the invention provides, in a plasma processing system, a treatment process gas composition for minimizing corrosion and polymer fence for a wafer's layer stack following metal etching. The composition contains helium and water and/or oxygen, or comparable gases.

These and other features and advantages of the present invention will become apparent upon reading the following detailed description and studying the various drawings.

DETAILED DESCRIPTION OF THE PREFERRED EMBODIMENTS

The present invention will now be described in detail with reference to a few preferred embodiments and associated drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

An invention is described for improved treatment of a semiconductor wafer's layer stack following metal etch using, in one embodiment, helium. For the purposes of the present invention this treatment includes passivation and/or strip of the layer stack. The treatment according to the present invention decreases the time necessary for passivation, increases the strip rate, and/or improves strip uniformity.

Figure 1A:
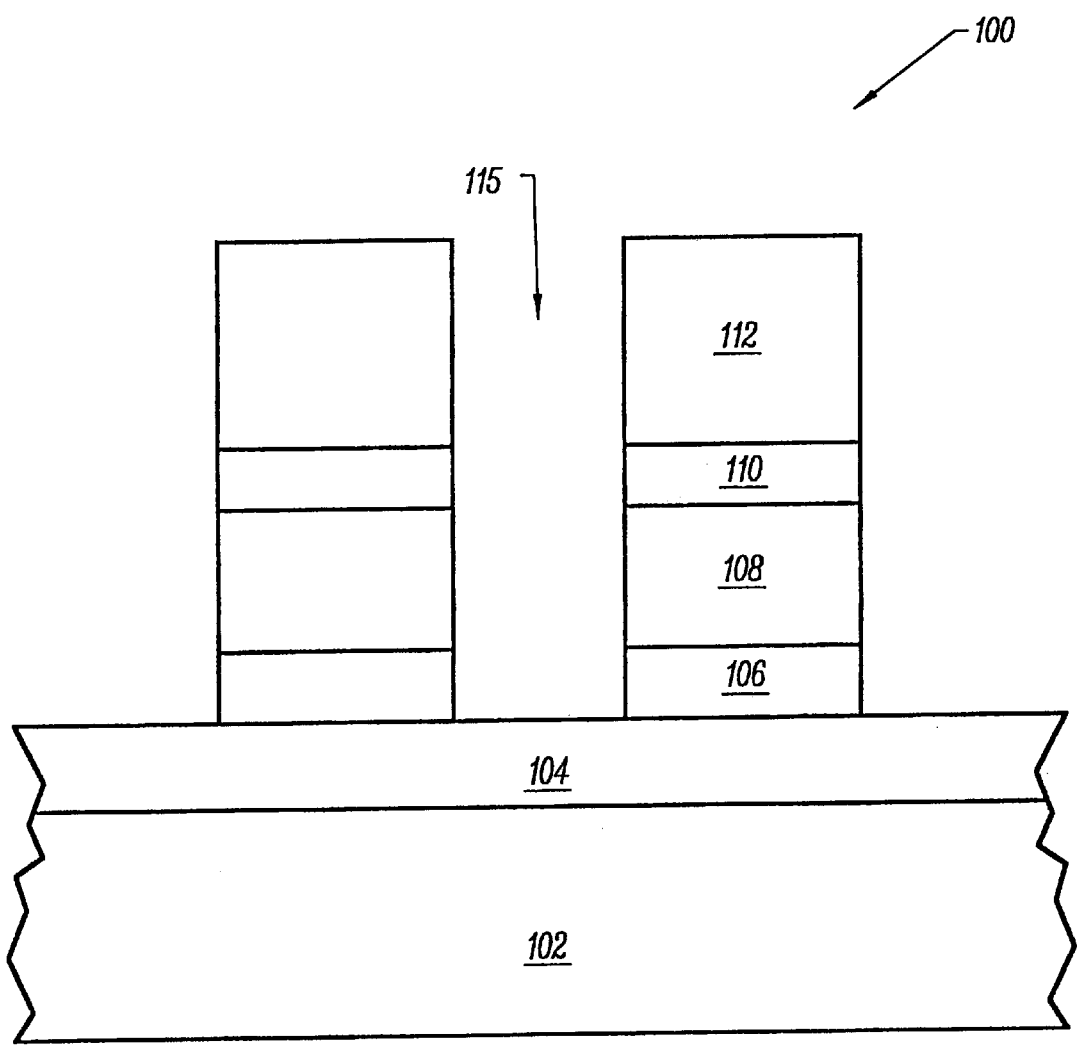
FIG. 1 illustrates a cross-sectional view of a layer stack following metal etch and before passivation and strip, representing the layers formed during the fabrication of a typical semiconductor IC.
FIG. 1B illustrates a cross-sectional view of the layer stack of FIG. 1A after conventional etch, passivation and strip are completed.
Figure 1B:
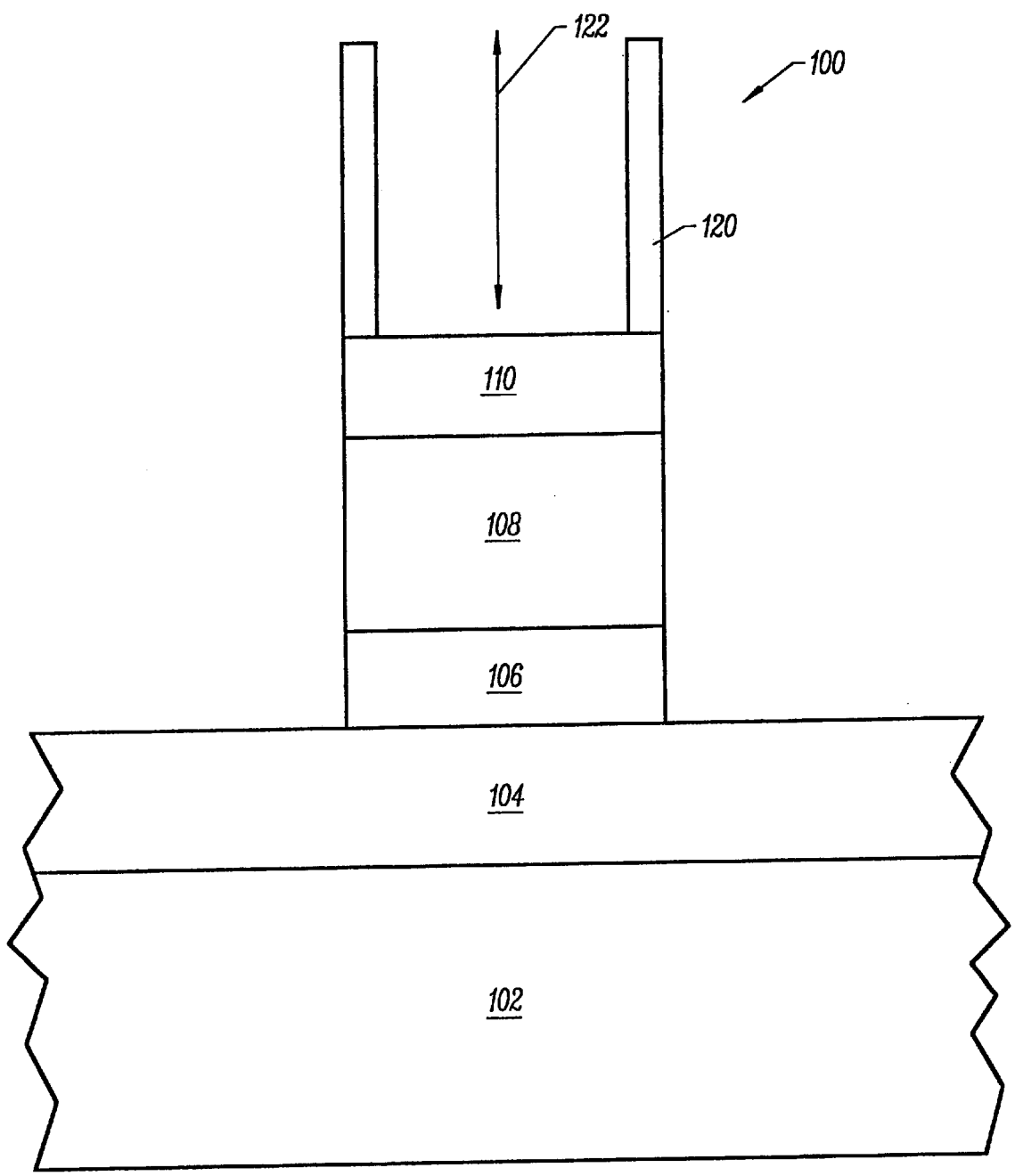
Figure 2:
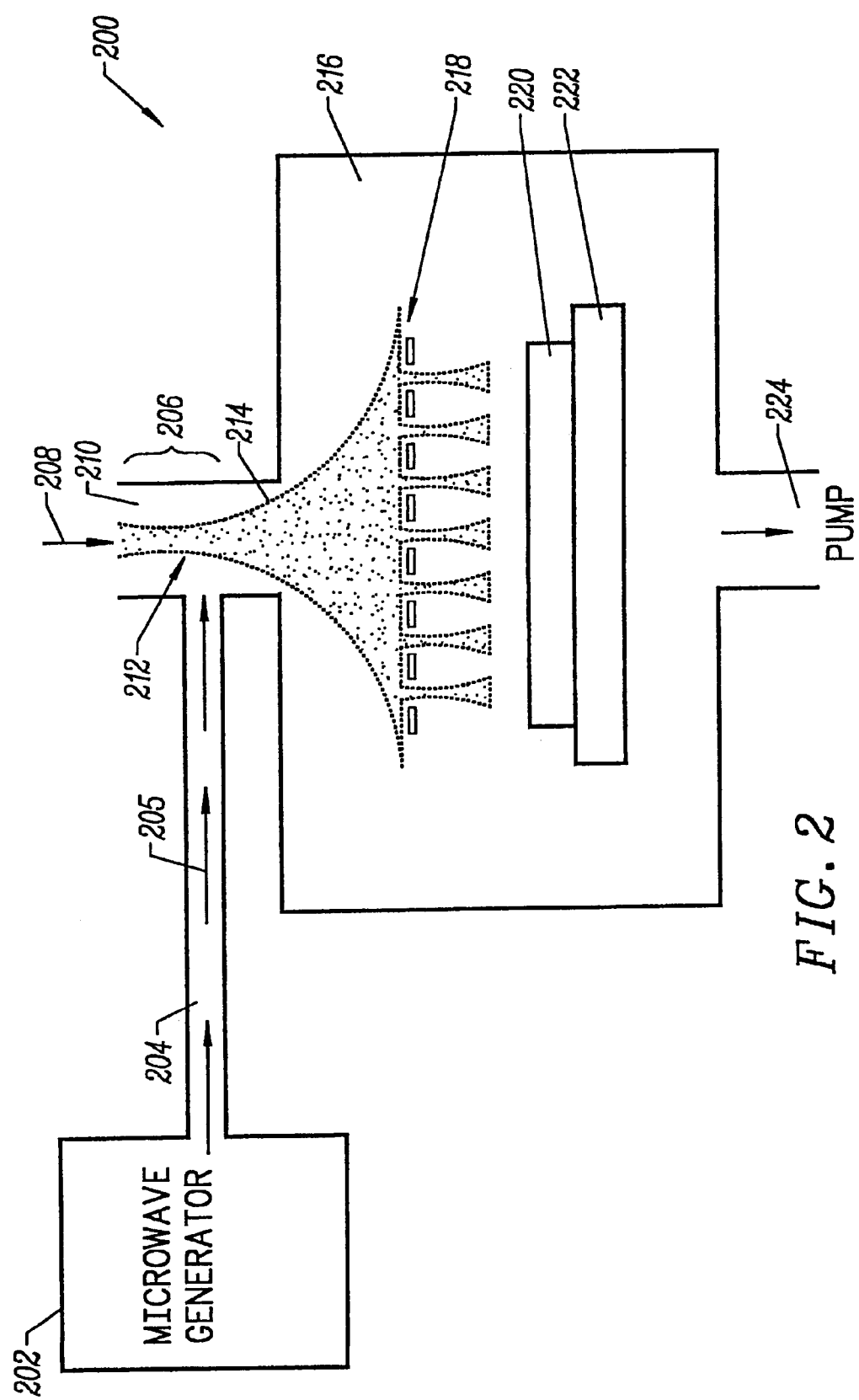
FIG. 2 is a simplified schematic diagram of a microwave plasma stripper that may be suitably employed with the inventive treatment technique.

In accordance with one embodiment of the present invention, the treatment of a layer stack is performed using a microwave stripper, such as that illustrated in FIG. 2. Such a microwave stripper may be a module of a plasma etcher. As very generally illustrated in the figure, microwave stripper 200 includes a microwave generator 202 operating at a frequency, for example, of 2.45 GHz, and preferably having a power in the range of about 500–1500 W, more preferably in the range of about 1000–1500 W, and most preferably of about 1250 W. The microwaves, represented by arrow 205, produced at generator 202 are propagated through waveguide 204 to plasma applicator 206. At least one source process gas, represented by arrow 208, flows into plasma applicator 206 through port 210, where it is excited by the microwaves 205 to form a plasma 212 which flows through port 214 into process chamber 216. The total flow rate of the source process gas is preferably in the range of about 500–6000 standard cubic centimeter per minute (sccm), more preferably in the range of about 2000–5000 sccm, and most preferably about 4000 sccm. The composition of source process gases according to various embodiments of the present invention is described below.

Inside the process chamber 216, the plasma is distributed by a baffle 218, before flowing onto the substrate 220 where it passivates and strips the layer stack (not shown). The substrate is positioned within the process chamber 216 on a bottom electrode 222 which is resistively heated to maintain a chuck temperature of preferably in the range of about 180°–300° C., more preferably in the range of about 225°–275° C., and most preferably at about 240° C. The pressure in the process chamber is preferably maintained in the range of about 0.5–4 Torr, more preferably in the range of about 1–3 Torr, and most preferably at about 2 Torr. The waste products generated by the passivation and strip are exhausted through port 224.

A preferred device for implementation of the present invention as described above is the Lam Research TCP™ 9600 SE plasma etcher, available from Lam Research Corporation, Fremont, Calif. This device incorporates a Chemical Plasma Source ("CPS"), manufactured by Applied Science and Technology, Inc. ("ASTeX") of Woburn, Mass. microwave source as part of its microwave stripping module. Although one preferred implementation of the present invention has been described, those of skill in the art will recognize that the invention may be implemented in other ways, for instance in other plasma processing systems.

The source process gases for the treatment of layer stacks according to the present invention include a helium component. It is believed that the presence of helium in one or more of the process gases of the present invention decreases the time necessary for passivation, increases the strip rate, and/or improves strip uniformity. In some embodiments of the present invention, the treatment may be performed in a single step using a single process gas to treat a layer stack. In other embodiments, a plurality of steps using different process gases may be used.

In a particularly preferred embodiment of the present invention, treatment of the metal etched layer stack is conducted in three steps using three different source process gases. In a passivation step, a process gas composed of helium (He) and water ($H_2O$) is used. Then, strip is conducted in two steps; the first step uses a process gas composed of helium, water and oxygen ($O_2$), and the second step uses a process gas composed of oxygen and nitrogen ($N_2$). The process gases are mixed before emerging into the process chamber, each constituent pure gas of the process gas being metered, for example, by a mass flow controller.

The flow ratio of helium to water forming the process gas in the first step of the treatment ranges preferably from about 40:1 to about 1:2, more preferably from about 20:1 to about 4:1, and is most preferably about 9:2. The flow ratio of helium to water to oxygen forming the process gas in the second step of the treatment preferably ranges from about 16:1:3 to about 2:1:20, more preferably from about 8:1:4 to about 2:1:15, and is most preferably about 5:3:17. The flow rate of oxygen to nitrogen forming the process gas in the third step of the treatment ranges from about 40:1 to about 2:1, more preferably from about 20:1 to about 5:1, and is most preferably about 9:1.

In several additional embodiments of the present invention, treatment is conducted in two steps with two different source process gases. In one of these embodiments, a process gas composed of helium, water and oxygen is used in a passivation step, and a process gas composed of oxygen and nitrogen is used in a second step to strip the layer stack. The flow ratio of helium to water to oxygen forming the process gas in the first step of the treatment preferably ranges from about 16:1:3 to about 2:1:20, more preferably from about 4:1:1 to about 1:1:4, and is most preferably about 1:1:1. The flow ratio of oxygen to nitrogen forming the process gas in the second step of the treatment preferably ranges from about 40:1 to about 2:1, more preferably from about 20:1 to about 5:1, and is most preferably about 9:1.

In another two-step embodiment, a process gas composed of helium and water is used in a passivation step, and a process gas composed of helium, water and oxygen is used in a second step to strip the layer stack. The flow ratio of helium to water forming the process gas in the first step of the treatment preferably ranges from about 40:1 to about 1:2, more preferably from about 20:1 to about 4:1, and is most preferably about 9:2. The flow ratio of helium to water to oxygen forming the process gas in the second step of the treatment preferably ranges from about 16:1:3 to about 2:1:20, more preferably from about 8:1:4 to about 2:1:15, and is most preferably about 5:3:17. Unlike the three-step process described above, this embodiment does not involve an additional step using an oxygen and nitrogen process gas.

In another embodiment, process gases having two different sets of components are used, with one set of components being used in different ratios at two different steps of the process. In this embodiment, a process gas composed of helium, water and oxygen is used in a passivation step, a second process gas composed of helium, water and oxygen is used in a first strip step, and a process gas composed of oxygen and nitrogen is used in a second strip step. The flow ratio of helium to water to oxygen forming the process gas in the first step of the treatment preferably ranges from about 16:1:3 to about 2:1:20, more preferably from about 4:1:1 to about 1:1:4, and is most preferably about 1:1:1. The flow ratio of helium to water to oxygen forming the process gas in the second step of the treatment (first strip step) preferably ranges from about 16:1:3 to about 2:1:20, more preferably from about 8:1:4 to about 2:1:15, and is most preferably about 5:3:17. The flow ratio of oxygen to nitrogen forming the process gas in the third step of the treatment (second strip step) preferably ranges from about 40:1 to about 2:1, more preferably from about 20:1 to about 5:1, and is most preferably about 9:1.

In other embodiments of the present invention, the treatment is conducted in a single step with a single source process gas. In one of these embodiments, a process gas composed of helium, water and oxygen is used. The flow ratio of helium to water to oxygen forming the process gas of the treatment preferably ranges from about 16:1:3 to about 2:1:20, more preferably from about 8:1:4 to about 2:1:15, and is most preferably about 5:3:17.

A process gas composed of helium and water is used in a further single source process gas embodiment of the present invention. The flow ratio of helium to water forming the process gas of the treatment preferably ranges from about 40:1 to about 1:2, more preferably from about 20:1 to about 4:1, and is most preferably about 9:1.

The method and compositions of the present invention can reduce the time required for passivation for a typical layer stack from about 60 s to about 30 s, or less. Also, up to a 70% reduction in polymer fence remaining following strip may be obtained. These improvements over conventional processes and compositions without helium are achieved with increased strip rates (as high as 4 $\mu$m/min or more) and/or improved uniformity (non-uniformity as low as 3% or better).

EXAMPLE 1

Figure 3:
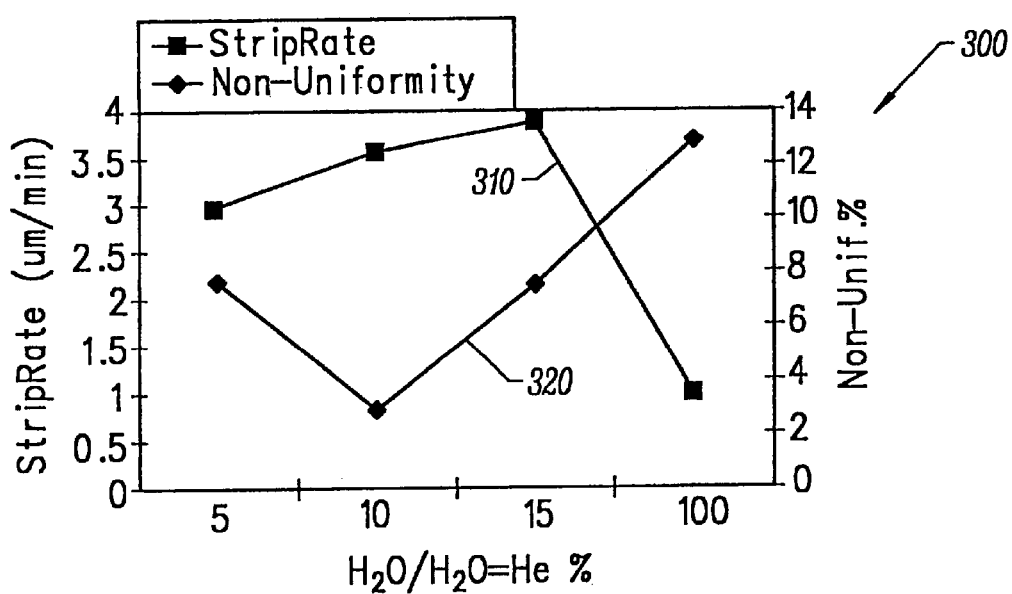
FIG. 3 is a sample plot of strip rate and non-uniformity versus relative percentage composition of $H_2O$ and He in a treatment process gas according to the present invention.

FIG. 3 is a plot 300 of strip rate and non-uniformity versus relative percentage composition of $H_2O$ and He in a strip process gas. The x-axis of the plot represents the relative composition of the source process gas composed of He and $H_2O$ ranging from 100% He (0% $H_2O$) on the left, to 100% $H_2O$ (0% He) on the right. The left-side y-axis represents the strip rate in microns per minute. The right-side y-axis represents percent uniformity of strip across the surface of the wafer determined by measuring at forty-nine preselected points on the wafer before and after strip. Lower percent non-uniformity indicates better uniformity.

The plotted experimental results were derived from treatment experiments performed on the following wafers according to the approximate process parameters outlined below. It should be borne in mind that this example is merely illustrative of one application of the inventive treatment technique and should in no way be construed to limit the usefulness of the invention when applied with other wafers, layer stack structures, etching systems, and/or process parameters.

Blanket photoresist wafers were partially stripped in the microwave stripping module of a Lam Research Alliance plasma etcher operating at 1250 W. The structure of the photoresist wafer was 1.7 $\mu$m I-line photoresist/1 KÅ $SiO_2$/Si substrate. A Prometrix FT-650 was used to measure the photoresist thickness and the uniformity. Measurements were taken at 49 probe sites with 3 mm exclusion.

Line 310 shows strip rate as a function of source process gas composition. The plot shows a variation in strip rate from about 1 $\mu$m/min for pure $H_2O$, to about 4 $\mu$m/min for about 85% He/15% $H_2O$. Line 320 shows uniformity as a function of source process gas composition. The plot shows a variation in non-uniformity from about 13% for pure $H_2O$, to about 3% for about 90% He/10% $H_2O$. From these plots, an optimum $H_2O$/He source process gas composition (highest strip rate with lowest percent non-uniformity) appears to be about 90% He/10% $H_2O$. A process gas with this composition provides a strip rate of about 3.5 $\mu$m/min with a non-uniformity of about 3%. In a typical wafer stack, data for source process gases including He, and having greater than 15% $H_2O$ are not shown on the plot since, at these ratios, undesirable burning at the circumference of the wafer was observed.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for treating a wafer's layer stack following metal etching, said method comprising:

providing a wafer layer stack in a plasma processing system following metal etching; and treating said layer stack in one or more steps, with at least one process gas comprising helium and one or more gases selected from the group consisting of water and oxygen, wherein said treatment is conducted in a plurality of steps with a plurality of process gases, one of said plurality of steps comprises a process gas consisting of helium, water and oxygen, and a second of said plurality of steps comprises a process gas consisting of oxygen and nitrogen.

2. The method of claim 1 wherein the flow ratio of helium to water to oxygen forming said process gas consisting of helium, water and oxygen and ranges from about 16:1:3 to about 2:1:20.

3. The method of claim 2 wherein the flow ratio of helium to water to oxygen forming said process gas ranges from about 8:1:4 to about 2:1:15.

4. The method of claim 3 wherein the flow ratio of helium to water to oxygen forming said process gas is about 5:3:17.

5. The method of claim 1 wherein the flow ratio of helium to water to oxygen in said first process gas ranges from about 16:1:3 to about 2:1:20, and the flow ratio of oxygen to nitrogen in said second process gas ranges from about 40:1 to about 2:1.

6. The method of claim 5 wherein the flow ratio of helium to water to oxygen in said first process gas ranges from about 4:1:1 to about 1:1:4, and the flow ratio of oxygen to nitrogen in said second process gas ranges from about 20:1 to about 5:1.

7. The method of claim 6 wherein the flow ratio of helium to water to oxygen in said first process gas is about 1:1:1, and the flow ratio of oxygen to nitrogen in said second process gas is about 9:1.

8. A method for treating a wafer's layer stack following metal etching, said method comprising:

providing a wafer layer stack in a plasma processing system following metal etching; and treating said layer stack in one or more steps, with at least one process gas comprising helium and one or more gases selected from the group consisting of water and oxygen, wherein said treatment is conducted in a plurality of steps with a plurality of process gases, one of said plurality of steps comprises a process gas consisting of helium and water, and a second of said plurality of steps comprises a process gas consisting of helium, water and oxygen.

9. The method of claim 8 wherein the flow ratio of helium to water in said first process gas ranges from about 40:1 to about 1:2, and the flow ratio of helium to water to oxygen in said second process gas ranges from about 16:1:3 to about 2:1:20.

10. The method of claim 9 wherein the flow ratio of helium to water in said first process gas ranges from about 20:1 to about 4:1, and the flow ratio of helium to water to oxygen in said second process gas ranges from about 8:1:4 to about 2:1:15.

11. The method of claim 10 wherein the flow ratio of helium to water in said first process gas is about 9:2, and the flow ratio of helium to water to oxygen in said second process gas is about 5:3:17.

12. A method for treating a wafer's layer stack following metal etching, said method comprising:

providing a wafer layer stack in a plasma processing system following metal etching; and treating said layer stack in one or more steps, with at least one process gas comprising helium and one or more gases selected from the group consisting of water and oxygen, wherein said treatment is conducted in a plurality of steps with a plurality of process gases, one of said plurality of steps comprises a process gas consisting of helium and water, a second of said plurality of steps comprises a process gas consisting of helium, water and oxygen, and a third of said steps comprises a process gas consisting of oxygen and nitrogen.

13. The method of claim 12 wherein the flow ratio of helium to water in said first process gas ranges from about 40:1 to about 1:2, the flow ratio of helium to water to oxygen in said second process gas ranges from about 16:1:3 to about 2:1:20, and the flow rate of oxygen to nitrogen in said third process gas ranges from about 40:1 to about 2:1.

14. The method of claim 13 wherein the flow ratio of helium to water in said first process gas ranges from about 20:1 to about 4:1, the flow ratio of helium to water to oxygen in said second process gas ranges from about 8:1:4 to about 2:1:15, and the flow rate of oxygen to nitrogen in said third process gas ranges from about 20:1 to about 5:1.

15. The method of claim 14 wherein the flow ratio of helium to water in said first process gas is about 9:2, the flow ratio of helium to water to oxygen in said second process gas is about 5:3:17, and the flow rate of oxygen to nitrogen in said third process gas is about 9:1.

16. The method of claim 8 wherein said plasma processing system is energized by a microwave plasma source.

17. The method of claim 8 wherein said plasma processing system operates at a power of about 1250 W, a pressure of about 2 Torr, and a temperature of about 240° C., and the total flow of said at least one process gases is about 4000 standard cubic centimeter per minute.

18. A method for minimizing corrosion and polymer fence for a wafer's layer stack following metal etching, said method comprising:

providing a wafer layer stack in a plasma processing system following metal etching; and treating said layer stack in one or more steps, with at least one process gas comprising helium and one or more gases selected from the group consisting of water and oxygen, wherein one of said plurality of steps comprises a process gas consisting of helium and water, and a second of said plurality of steps comprises a process gas consisting of helium, water and oxygen.

* * * * *